United States Patent [19]

Kawamoto

[11] 3,908,188

[45] Sept. 23, 1975

[54] HEAT SINK FOR MICROSTRIP CIRCUIT

[75] Inventor: Hirohisa Kawamoto, Kendall Park, N.J.

[73] Assignee: The United States of America as represented by the Secretary of the Air Force, Washington, D.C.

[22] Filed: Aug. 14, 1974

[21] Appl. No.: 497,415

[52] U.S. Cl. ...................... 357/82; 357/80; 357/81; 317/100; 174/15 R; 174/DIG. 5; 333/84 M

[51] Int. Cl.$^2$. H01L 25/04; H01P 3/00; H02B 1/00; H01B 7/34

[58] Field of Search ................ 357/81, 82; 317/100; 174/DIG.5, DIG. 3, 15, 16 R; 333/84 M

[56] References Cited

UNITED STATES PATENTS

| | | | |
|---|---|---|---|
| 3,573,557 | 4/1971 | Riggs | 317/100 |
| 3,611,046 | 10/1971 | Covert | 357/82 |

*Primary Examiner*—Michael J. Lynch
*Assistant Examiner*—E. Wojciechowicz
*Attorney, Agent, or Firm*—Joseph E. Rusz; James S. Shannon

[57] ABSTRACT

An individual heat sink for a solid state element such as a diode encased in a standard package of the type in which one of the diode terminals is a conductive cap and the other a conductive threaded stud concentric with the cap and of smaller diameter, such as used with microwave striplines. The heat sink body is in the form of a hollow externally threaded cylinder with end closures forming a cavity through which a liquid coolant may be circulated. One end closure is in the form of a truncated cone which is drilled and tapped to receive the threaded stud of the diode package. A holder attached beneath the stripline structure has an opening threaded to receive the externally threaded heat sink body, whereby the position of the body relative to stripline ground plane may be adjusted. The diode package is screwed into the heat sink body through a hole in the stripline structure, compressing the stripline structure between the diode package cap and the heat sink body to provide good electrical contact between the stripline and the diode terminals.

2 Claims, 5 Drawing Figures

HEAT SINK FOR MICROSTRIP CIRCUIT

RIGHTS OF THE GOVERNMENT

The invention described herein may be manufactured and used by or for the Government of the United States for all governmental purposes without the payment of any royalty.

BACKGROUND OF THE INVENTION

The invention pertains to the cooling of electronic components, particularly small solid state diodes used as active elements in microwave stripline circuits and operated at relatively high power levels.

The usual practice is to mount the diode in thermally conductive contact with a metallic plate which serves as a heat sink and which in some instances may be provided with fins to promote heat loss by convection and radiation. The small size of the diodes used in microwave circuits results in high temperatures and complicates the problem of transferring heat away from the diode fast enough to limit the temperature to a safe value.

SUMMARY OF THE INVENTION

The purpose of the invention is to provide a heat sink that is particularly suited to microwave stripline applications, that accommodates diodes of a standard diode package outline used with striplines, that is small in size and individual to the diode but is capable of removing heat at a sufficiently high rate to keep the diode at a safe temperature, that can adjust to different thicknesses of panel or substrate on which the stripline may be mounted, and that provides establishing good electrical contact between the terminals of the diode and the conductors of the stripline. Briefly, the heat sink comprises a hollow cylindrical body threaded externally and closed at each end. One end closure is in the form of a truncated cone having a tapped hole at the center of the truncated apex to receive the threaded stud which constitutes one of the terminals of the diode. The other terminal of the diode is in the form of a conductive cap of larger diameter than the stud and separated therefrom by a section of electrical insulation. With its truncated end facing the ground plane of the stripline, the cylindrical body of the heat sink is threaded into a holder, which is attached to the underside of the stripline structure or its supporting panel or substrate if any, until the truncated end, extending through a hole in the panel or substrate if one is used, is in contact with the ground plane of the stripline. The diode stud is then screwed into the heat sink through aligned holes in the stripline, insulation, and ground plane until the cap of the diode is in contact with the stripline. Further tightening of the diode compresses the stripline structure between the diode cap and the heat sink thereby insuring good electrical contact between the diode terminals and the stripline. The closure of the other end of the cylindrical body of the heat sink contains inlet and outlet conduits for the circulation of a liquid coolant through the hollow interior of the heat sink.

DETAILED DESCRIPTION

Figures 1, 2, 3, 4, 5:
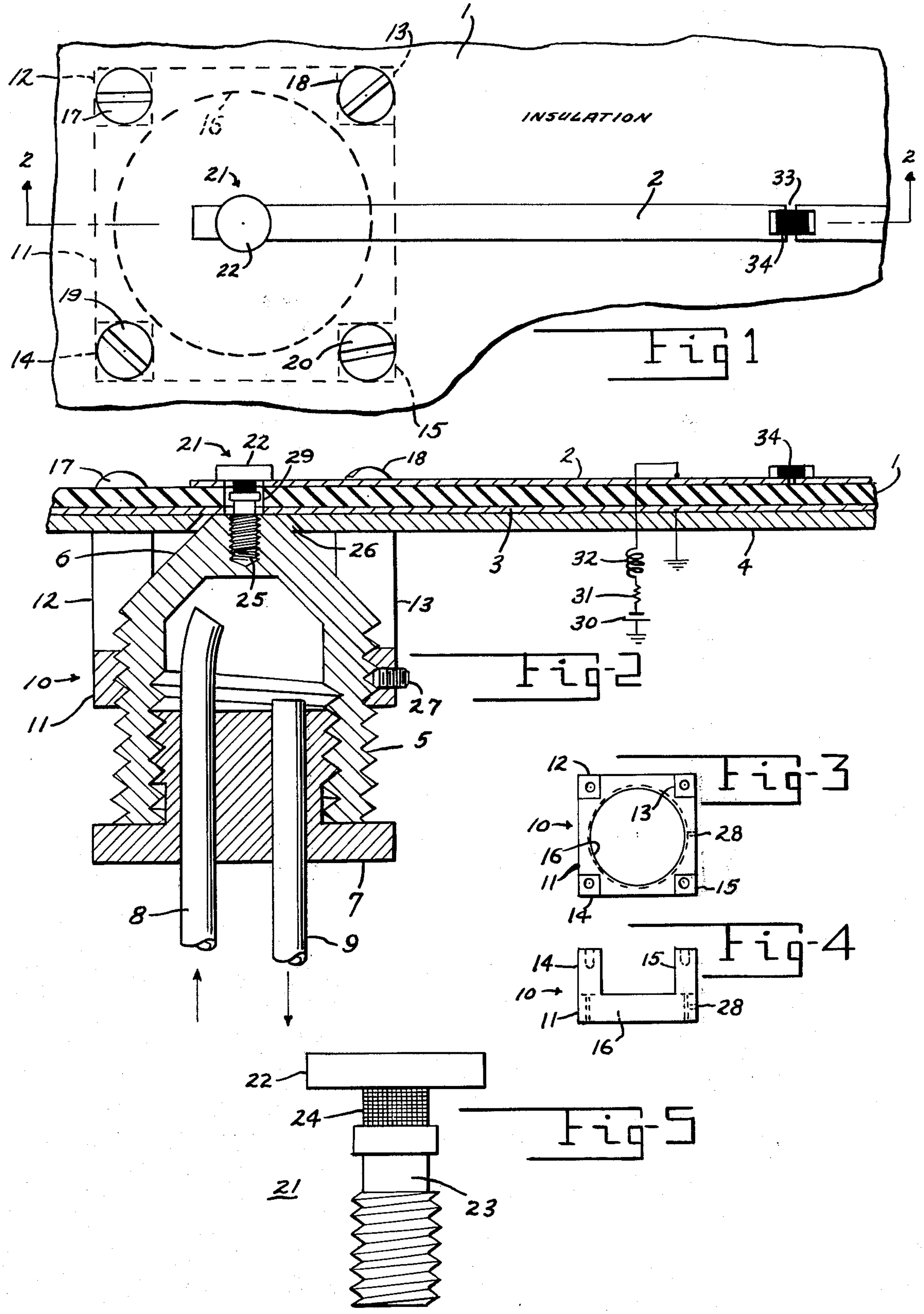
FIG. 1 is a plan of a stripline structure containing a diode provided with a heat sink in accordance with the invention.
FIG. 2 is a sectional elevation of the structure of FIG. 1 taken along line 2—2.
FIGS. 3 and 4 are plan and elevation, respectively, to a reduced scale, of the heat sink holder used in the structure of FIGS. 1–2.
FIG. 5 is an elevation to an enlarged scale of the diode shown in FIGS. 1 and 2.

Referring to FIGS. 1 and 2, microwave striplines are usually constructed from commercially available laminates consisting of a sheet of insulation 1 initially clad on both sides with layers of a suitable conductive material such as copper. The top layer may be etched away except along a narrow strip 2 which forms the upper conductor of the stripline. The bottom layer 3 may be left intact to form a ground plane which serves as the other conductor of the stripline. In some cases the stripline structure may rest on a metallic panel or substrate 4.

The body of the heat sink comprises a hollow, externally cylindrical structure 5 made of a material having good thermal conductivity such as copper and having an integral closure 6 for one end in the form of a truncated cone. The body is internally threaded at the other end to receive a screw plug closure. The plug 7 contains inlet and outlet conduits 8 and 9 for the circulation of a suitable liquid coolant such as water through the closed cavity of the heat sink body 5.

The heat sink body is supported beneath the stripline structure by a holder 10, shown also in FIGS. 3 and 4 to a reduced scale. The holder may be an integral structure, made of a suitable material such as brass, having a bottom plate 11 and corner posts 12–15. The bottom plate 11 has a threaded opening 16 to receive the externally threaded heat sink body 5. The holder is attached beneath the substrate structure as by screws 17–20.

The outline of the diode package 21 is shown more clearly in FIG. 5. The diode package comprises a conductive cap 22 and a threaded stud 23 which constitute the two terminals of the diode and which are separated by an insulating section 24. A junction diode contained within the package is internally connected to the terminals 22 and 23. The flat end of the truncated portion 6 of the heat sink body is centrally drilled and tapped at 25 to receive the threaded stud of the diode package.

In assembling the heat sink to the stripline structure, the heat sink body 5, with the truncated end facing the ground plane of the stripline, is screwed into the holder 10 until the flat end of portion 6, extending through a hole 26 in panel or substrate 4 if used, contacts the ground plane 3. The heat sink body may be locked in this position by set screw 27 for which a drilled and tapped hole 28 is provided in the holder 10. Diode package 21 is then passed through a hole 29 in the stripline structure and screwed into the heat sink until cap 22 is in contact with stripline conductor 2. Further tightening of the diode package compresses the stripline structure between the cap 22 and the flat end of the heat sink and insures good electrical contact between the stripline and the terminals 22 and 23 of the diode. The hole 29 in the stripline should be only slightly larger than the maximum diameter of threaded stud 23 in order to insure sufficient contact area between conductor 2 and cap 22 and between the ground plane 3 and the heat sink. Since the body 5 is adjustable in holder 10, the device can accommodate easily to different thickness of panel 4, or the panel may be omitted and the holder mounted directly against the ground plane 3.

Provisions for applying a direct biasing voltage to diode 21 are shown schematically in FIG. 2. The biasing circuit comprises direct voltage source 30, resistor 31, and r.f. choke 32. A gap 33 is provided in stripline conductor 2 to block direct current from the remainder of the circuit. The gap is bridged for high frequency currents by microwave chip capacitor 34. The microwave stripline circuit shown constitutes a high frequency oscillator in which the diode may be a tunnel diode acting as a negative resistance.

In order to give an idea of the physical size of the components shown, the width of stripline conductor 2 may be 0.090 inch, the maximum diameter of the threaded stud 23 of the diode may be 0.0990 inch with a 3 × 48 thread, and the maximum diameter of heat sink body 5 may be 0.875 inch with 14 threads per inch.

While the invention has been described in a stripline application, it is obvious that other circuit board applications would be possible.

I claim:

1. An individual heat sink for a solid state diode in a microwave stripline circuit, said diode being in a standard package of the type in which one diode terminal is a conductive cap and the other a conductive threaded stud concentric with the cap but of smaller diameter, and said stripline circuit being in the form of a conductive ground plane, a layer of insulation over the ground plane, and a conductive strip on the insulation, said heat sink comprising: a body made of a material of good heat and electrical conductivity in the form of a hollow externally threaded cylinder with end closures forming a cavity, one end closure being in the form of a truncated cone having at the center of its flat top a blind hole tapped to receive the threaded stud of the diode package and the other end closure containing inlet and outlet conduits for the passage of a liquid coolant through said cavity; and a holder attached to the strip-line structure beneath the ground plane, said holder having a circular opening with axis normal to the ground plane and threaded to receive the externally threaded heat sink body, whereby said body may be screwed into said holder with its truncated end facing said ground plane until the truncated end is in contact with the ground plane, and whereby said diode package may be screwed into the truncated end of said body through aligned holes in the conductive strip, insulation, and ground plane of the stripline structure, which holes are larger in diameter than said stud but smaller than said cap, until the stripline structure is compressed between the cap of the diode package and the truncated end of said heat sink body to provide good electrical contact between the stripline and the diode terminals.

2. Apparatus as claimed in claim 1 in which said tapped blind hole is of sufficient depth to prevent bottoming of the threaded stud of the diode package before the stripline structure has become compressed between the cap of the diode package and the truncated end of the heat sink body.

* * * * *